(12) United States Patent
Chen et al.

(10) Patent No.: US 9,871,102 B2
(45) Date of Patent: Jan. 16, 2018

(54) METHOD OF FORMING A SINGLE-CRYSTAL NANOWIRE FINFET

(71) Applicant: UNITED MICROELECTRONICS CORP., Hsin-Chu (TW)

(72) Inventors: Hsin-Yu Chen, Hsinchu County (TW); Huai-Tzu Chiang, Tainan (TW); Sheng-Hao Lin, Hsinchu County (TW); Hao-Ming Lee, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/684,443

(22) Filed: Apr. 13, 2015

(65) Prior Publication Data

US 2016/0268375 A1    Sep. 15, 2016

(30) Foreign Application Priority Data

Mar. 13, 2015    (CN) .......................... 2015 1 0111039

(51) Int. Cl.
| | |
|---|---|
| *H01L 29/66* | (2006.01) |
| *H01L 29/06* | (2006.01) |
| *H01L 29/78* | (2006.01) |
| *H01L 29/786* | (2006.01) |
| *H01L 29/423* | (2006.01) |
| *H01L 21/02* | (2006.01) |
| *H01L 29/10* | (2006.01) |

(52) U.S. Cl.
CPC .... *H01L 29/0673* (2013.01); *H01L 21/02532* (2013.01); *H01L 21/02667* (2013.01); *H01L 29/0649* (2013.01); *H01L 29/1083* (2013.01); *H01L 29/42392* (2013.01); *H01L 29/66742* (2013.01); *H01L 29/786* (2013.01); *H01L 29/7848* (2013.01)

(58) Field of Classification Search
CPC ........... H01L 29/0673; H01L 29/78696; H01L 29/42392
See application file for complete search history.

(56) References Cited

U.S. PATENT DOCUMENTS

| | | | |
|---|---|---|---|
| 8,753,942 B2 | 6/2014 | Kuhn | |
| 2004/0166642 A1* | 8/2004 | Chen .................... | B82Y 10/00 438/284 |
| 2004/0219722 A1* | 11/2004 | Pham .................... | H01L 29/785 438/157 |
| 2006/0261409 A1* | 11/2006 | Cho .................... | H01L 29/0673 257/347 |
| 2007/0126035 A1* | 6/2007 | Ernst ................ | H01L 29/42384 257/288 |
| 2008/0020537 A1* | 1/2008 | Kim .................. | H01L 29/78696 438/308 |
| 2014/0319543 A1* | 10/2014 | Yin ..................... | H01L 29/0684 257/77 |
| 2015/0137236 A1* | 5/2015 | Liu ..................... | H01L 27/1211 257/347 |

* cited by examiner

*Primary Examiner* — Thao X Le
*Assistant Examiner* — Laura Dykes
(74) *Attorney, Agent, or Firm* — Winston Hsu (57) ABSTRACT

A semiconductor device and a method of forming the same, the semiconductor device includes a single crystal substrate, a source/drain structure and a nanowire structure. The source/drain structure is disposed on and contacts with the substrate. The nanowire structure is connected to the source/drain structure.

11 Claims, 6 Drawing Sheets

METHOD OF FORMING A SINGLE-CRYSTAL NANOWIRE FINFET

BACKGROUND OF THE INVENTION

1. Field of the Invention

The invention relates to a semiconductor device and a method of forming the same, and more particularly, to a semiconductor device having a nanowire structure and a method of forming the same.

2. Description of the Prior Art

Conventional planar metal-oxide-semiconductor (MOS) transistor has difficulty when scaling down to 65 nm and below. Therefore the non-planar transistor technology such as fin field effect transistor (FinFET) technology that allows smaller size and higher performance is developed to replace the planar MOS transistor. For example, dual-gate FinFET device, tri-gate FinFET device, and omega-FinFET device have been provided. Furthermore, gate-all-around (GAA) nanowire FET device is progressed for achieving the ongoing goals of high performance, low cost, increased miniaturization of integrated circuit components, and greater packaging density of integrated circuits.

SUMMARY OF THE INVENTION

It is one of the primary objectives of the present invention to provide a semiconductor device, which includes a nanowire structure, so as to achieve preferable performance.

It is another one of the primary objectives of the present invention to provide a method of forming a semiconductor device, which may simplify the fabrication process of the nanowire structure, and precisely control the critical dimension of such nanowire structure.

To achieve the purpose described above, the present invention provides a semiconductor device including a single crystal substrate, a source/drain structure and a nanowire structure. The source/drain structure is disposed on and contacts with the substrate. The nanowire structure is connected to the source/drain structure.

To achieve the purpose described above, the present invention provides a method of forming a semiconductor device including the following steps. First of all, at least one dielectric layer and at least one first material layer stacked sequentially are formed on a substrate. Next, the first material layer and the dielectric layer are etched to expose a portion of the substrate. Then, a second material layer is formed on the portion of the substrate. Subsequently, the first material layer is transformed into a single crystal material layer, and the dielectric layer is removed to form a nanowire structure.

Through the method of forming a semiconductor device of the present invention, the amorphous semiconductor material layers are directly formed previously, and then transformed into single crystal semiconductor material layers, so as to simplify the fabrication process of the nanowire structure, source/drain structure and the supporting structure, as well as to effectively control the critical dimension of the nanowire structure. Thus, according to the aforementioned steps, a gate structure surrounding the nanowire structural channel is then obtained successfully, thereby functioning as a gate-all-around transistor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred embodiments will be described in detail. The preferred embodiments of the present invention are illustrated in the accompanying drawings with numbered elements.

Figure 1:
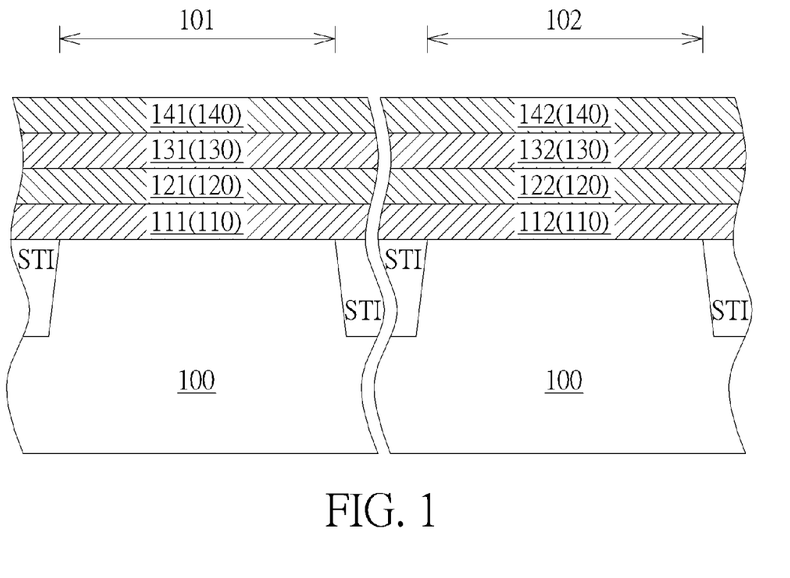
FIG. 1 to FIG. 9 are schematic diagrams illustrating a method of forming a semiconductor device according to one preferred embodiment of the present invention.

Please refer to FIG. 1 to FIG. 9, which are schematic diagrams illustrating a method of forming a semiconductor device according to one preferred embodiment of the present invention. First of all, as shown in FIG. 1, a substrate 100 is provided, and the substrate 100 preferably includes a single crystal substrate having a semiconductor material, such as silicon (Si), epitaxial silicon, silicon germanium (SiGe) or silicon carbide (SiC), but not limited thereto.

In one embodiment, a plurality of first shallow trench isolation (STI) may be formed previously on the substrate 100, thereby defining a first active region 101 and a second active region 102 which are isolated from each other through the shallow trench isolation STI, as shown in FIG. 1. According to the forming method of the present invention, nanowire transistors having the same structure or the same material may be formed optionally in the first active region 101 and the second active region 102, or nanowire transistors having different structures or different materials may be formed, but is not limited thereto. In other embodiments, transistors (not shown in the drawings) in different conductive types may also be formed on the substrate 100, within first active region 101 and the second active region 102 respectively, so that, the forming method of the present invention may also be applied on forming a complementary metal oxide semiconductor (CMOS) having a nanowire transistor.

Further in view of FIG. 1, in one embodiment, at least one dielectric layer 110, 130, and at least one first material layer 120, 140 stacked on each other are formed respectively on the substrate 100, within the first active region 101 and the second active region 102, such that a stack structure is formed on the substrate 100, within the first active region 101 and the second active region 102 respectively. Precisely, the stack structure formed in the first active region 101 includes a dielectric layer 111, a first material layer 121, a dielectric layer 131 and a first material layer 141 stacked on each other; and the stack structure formed in the second active region 102 includes a dielectric layer 112, a first material layer 122, a dielectric layer 132 and a first material layer 142 stacked on each other.

Precisely speaking, the dielectric layers 110, 130 and the first material layers 120, 140 for example are formed on the substrate 100 sequentially through a chemical/physical vapor deposition process, but not limited thereto. The first material layers 120, 140 preferably include amorphous semiconductor material, such as amorphous silicon (α-Si), amorphous germanium (α-Ge), or amorphous silicon germanium (α-SiGe), wherein a concentration of germanium therein may increase by the process time but will not be greater than 60%. The dielectric layer 110, 130 may include silicon dioxide (SiO$_2$), silicon nitride (SiN), silicon oxynitride (SiON) or other suitable low dielectric constant (low-k) materials, but not limited thereto. Furthermore, in one embodiment, each of the first materials 121, 122, 141, 142 in the first active region 101 and the second active region 102 may include the same or different materials. For example, the first material layer 121 and the first material layer 141 may both include amorphous silicon, or the first material layer 121 may include amorphous silicon and the first material layer 141 may include other amorphous materials, such as amorphous silicon germanium. Also, in another embodiment, the dielectric layer 110 may preferably include a bilayer structure which may be formed by firstly forming a first layer (not shown in the drawings) directly contacted with the substrate 100 through a thermal oxidation process, and then forming a second layer (not shown in the drawings) deposited on the first layer by using a chemical vapor deposition process, such that the first layer and the second layer may have different etching selectivity due to various material densities or compositions. The dielectric layer 130 may preferably be formed through the same forming method of the second layer, so as to obtain the same material density as the second layer and share the same etch rate accordingly.

Figure 2:
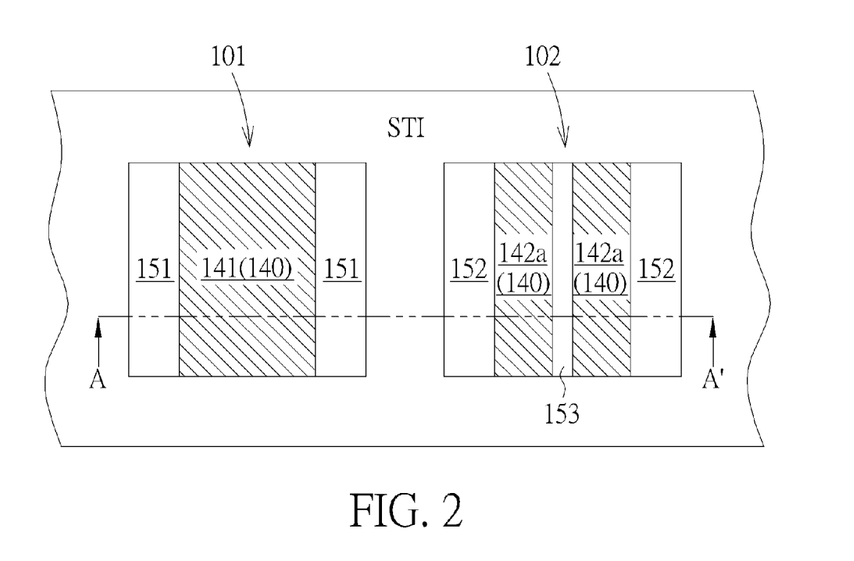
Figure 3:
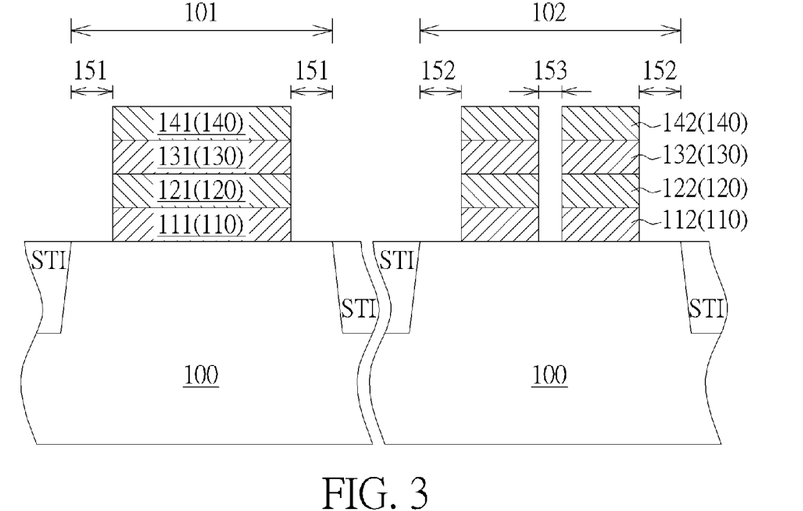

Next, as shown in FIG. 2 to FIG. 3, FIG. 3 is a cross-sectional schematic view taken along the cross line A-A' in FIG. 2, and which illustrates patterning the first material layer 141, the dielectric layer 131, the first material layer 121 and the dielectric layer 111 stacked on the first active region 101, and the first material layer 142, the dielectric layer 132, the first material layer 122 and the dielectric layer 112 stacked on the second active region 102, to form source/drain regions 151 on the substrate 100, within the first active region 101, and source/drain regions 152 on the substrate 100, within the second active region 102. The method of patterning the aforementioned stack structures may include forming a first mask layer (not shown in the drawings) in the first active region 101 and the second active region 102 respectively, covering a portion of each of the stack structures to define the source/drain regions 151, 152. Then, an etching process is performed, to remove a portion of the first material layer 141, the dielectric layer 131, the first material layer 121 and the dielectric layer 111 stacked outside the first active region 101, and to remove a portion of the first material layer 142, the dielectric layer 132, the first material layer 122 and the dielectric layer 112 stacked outside the second active region 102, thereby exposing the portion of the substrate 100 in the source/drain regions 151, 152, and the first shallow trench isolation (STI), as shown in FIG. 2. Wherein, the aforementioned etching process may include a dry etching process and/or a wet etching process, but not limited thereto. Subsequently, the first mask layer is removed, and a cleaning process may be optionally performed then.

In one embodiment, the source/drain regions 151, 152 are formed at two sides of the patterned stack structures. Also, in another embodiment, a supporting region 153 may be further formed while the source/drain regions 152 are defined in the second active region 102. For example, while defining the source/drain regions 152 in the second active region 102 through the first mask layer, the supporting region 153 is defined simultaneously, and then the first material layer 142, the dielectric layer 132, the first material layer 122 and the dielectric layer 112 stacked in the supporting region 153 are also removed through the etching process, thereby exposing the portion of the substrate 100 in the supporting region 153, as shown in FIG. 2. In one embodiment, the supporting region 153 is preferably formed between the source/drain regions 152, so as to divide the stack structure (including the first material layer 142, the dielectric layer 132, the first material layer 122 and the dielectric layer 112) formed in the second active region 102 into two parts (including first material layers 142a, 142b, dielectric layers 132a, 132b, first material layers 122a, 122b and dielectric layers 112a, 112b), as shown in FIG. 3. In another embodiment, a plurality of shallow trenches may be optionally formed while the source/drain regions 151, 152 are defined, which means that a plurality of shallow trench isolated regions which are isolated from each other may be defined while the source/drain regions 151, 152 are formed simultaneously.

Figure 4:
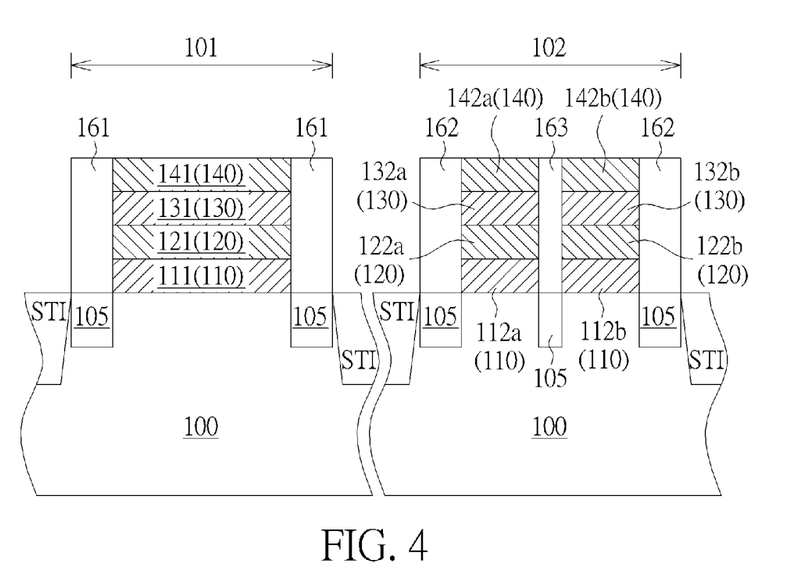

Next, as shown in FIG. 4, source/drain structures 161, 162 which directly contact the exposed portion of the substrate 100 are formed respectively in the source/drain regions 151, 152 in the first active region 101 and the second active region 102. In one embodiment the method of forming the source/drain structures 161, 162 may include directly forming a second material layer in the source/drain regions 151, 152 through a chemical/physical vapor deposition process, functioned as the source/drain structures 161, 162. Otherwise, the forming method thereto may also include selectively forming the source/drain structures 161, 162 through an epitaxial growing process, such as a low temperature epitaxial growing process. Moreover, the second material layer may include amorphous silicon, single crystal silicon, amorphous germanium, single crystal germanium, amorphous silicon germanium, or single crystal silicon germanium, but not limited thereto. It is worth mentioning that, in one embodiment, the first material layers 120, 140 may include the same material or materials in the same crystallization as that of the second material layer, or include different materials or materials in different crystallizations from that of the second material layer. For example, the first material layers 120, 140 may include amorphous silicon, and the second material layer may also include amorphous silicon, or include single crystal silicon.

In one embodiment, an ion implantation process, such as an anti punch through implantation (APT), may be further performed optionally, in the substrate 100, in the exposed source/drain regions 151, 152, to implant an ion having a contrast conductive type to the source/drain regions 151, 152, thereby forming an anti punch through implantation region 105 in the substrate 100, under the source/drain regions 151, 152, as shown in FIG. 4. For example, if a P type transistor is formed in the first active region 101, an N type ion will be implanted into the anti punch through implantation region 105, to ensure the source/drain structures 161 formed subsequently are electrically isolated from the substrate 100, and to avoid signals of the source/drain structures 161 being transferred through the substrate 100 and affecting the transistor performance. Conversely, if an N type transistor is formed in the first active region 101, a P type ion will then be implanted into the anti punch through implantation region 105.

Additionally, in another embodiment, a supporting structure 163 may also be formed in the supporting region 153 while the source/drain structures 162 are formed in the second active region 102, wherein the supporting structure 163 and the source/drain structures 162 are formed simultaneously. In other words, the second material layer is formed both in the source/drain regions 151, 152 and the supporting region 153, so that the supporting structure 163 may include the same material as the source/drain structures 162. Otherwise, in another embodiment, the source/drain structures 162 and the supporting structure 163 may also be formed sequentially, so as to obtain different forming materials. Furthermore, the anti punch through implantation ion may also be implanted into the substrate 100 in the supporting region 153 to form the anti punch through implantation region 105 underneath, while it is implanted into the substrate 100 of the source/drain regions 152, as shown in FIG. 4.

Figure 5:
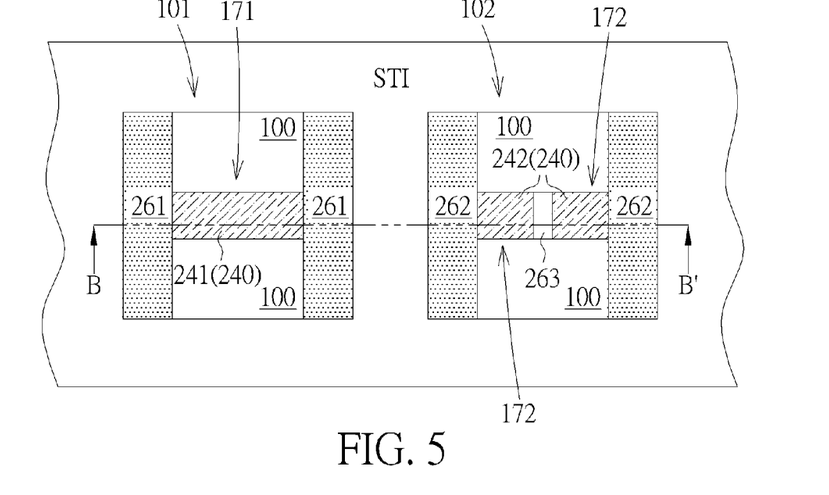
Figure 6:
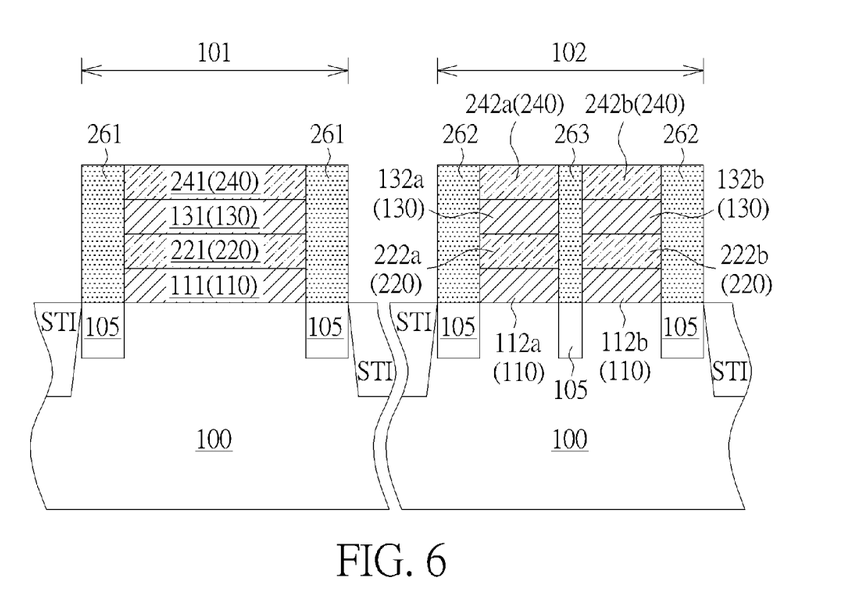

After that, as shown in FIG. 5 to FIG. 6, FIG. 6 is a cross-sectional schematic view taken along the cross line B-B' in FIG. 5. First of all, the first material layer 141, the dielectric layer 131, the first material layer 121 and the dielectric layer 111 stacked on the first active region 101, and the first material layer 142, the dielectric layer 132, the first material layer 122 and the dielectric layer 112 stacked on the second active region 102 are patterned in further, to define nanowire regions 171, 172 within the second active region 102 respectively. The method of further patterning the aforementioned stack structures may include forming a second mask layer (not shown in the drawings) in the first active region 101 and the second active region 102 respectively, covering another portion of each of the stack structures. Then, another etching process is performed, to remove a portion of the first material layer 141, the dielectric layer 131, the first material layer 121 and the dielectric layer 111 stacked in the first active region 101, and to remove a portion of the first material layer 142, the dielectric layer 132, the first material layer 122 and the dielectric layer 112 stacked in the second active region 102, to keep the material layers 120, 140 and the dielectric layers 110, 130 stacked in the nanowire regions 171, 172, as shown in FIG. 5. After that, the second mask layer is removed, and another cleaning process may be optionally performed then.

It is worth mentioning that, the etching process, such as a dry etching process and/or a wet etching process, completely remove the first material layers 140, 120 and the dielectric layer 130 stacked outside the nanowire regions 171, 172, but only partially remove the dielectric layer 110 outside the nanowire regions 171, 172, such that a certain thickness of the dielectric layer 110 remains on the substrate 100, outside the nanowire regions 171, 172, to electrically isolate the substrate 100 and a gate structure formed subsequently, as shown in FIG. 5. In one embodiment, if the dielectric layer 110 has the aforementioned bilayer structure, the dielectric layer 130 and the second layer of the dielectric layer 110 may be optionally removed in the etching process, and the first layer of the dielectric layer 110 remains on the substrate 100, outside the nanowire regions 171, 172, to electrically isolate the substrate 100.

It is also worth mentioning that a recrystallization process may be performed either before or after the first material layer 140, the dielectric layer 130, the first material layer 120 and the dielectric layer 110 are further patterned. As shown in FIG. 5 and FIG. 6, after such stack structures are further patterned, the recrystallization process is performed to make the semiconductor material layers stacked in the first active region 101 (namely, in nanowire region 171) and in the second active region 102 (namely, in nanowire region 172) being transformed into single crystal type. In other words, if the first material layers 120, 140 and/or the second material layer (source/drain structures 161, 162) formed in the previous steps include amorphous semiconductor material, and such amorphous semiconductor material may be transformed into single crystal semiconductor material, such as single crystal silicon (S—Si), single crystal germanium (S—Ge) or single crystal silicon germanium (S—SiGe) through the recrystallization process, and to form first material layers 241, 242, 221, 222 and source/drain structures 261, 262 shown in FIG. 5 and FIG. 6. Also, in one embodiment, the supporting structure 163 formed in the second active region 102 may also include amorphous semiconductor material, and such amorphous semiconductor material thereof may also be transformed into single crystal semiconductor material, to form a supporting structure 263 shown in FIG. 6.

Precisely speaking, in one embodiment, the recrystallization process may include a thermal process, such as substantially heating at 500° C. to 700° C., or may include a laser process, such as using laser beam irradiating the first material layers 120, 140 and/or the second material layer to transform them. However, people who are skilled in the art shall realize the recrystallization process of the present invention is not limited thereto, and may include other suitable processes to transform the amorphous semiconductor material into single crystal semiconductor material. Furthermore, in another embodiment, the timing of performing the recrystallization process may also be modified, for example, performing the recrystallization process right after the source/drain structures 161, 162 are formed, and the nanowire regions 171, 172 are then defined in the first active region 101 and the second active region 102 subsequently. Otherwise, the recrystallization process may also be performed after a complete nanowire structure is formed.

Figure 7:
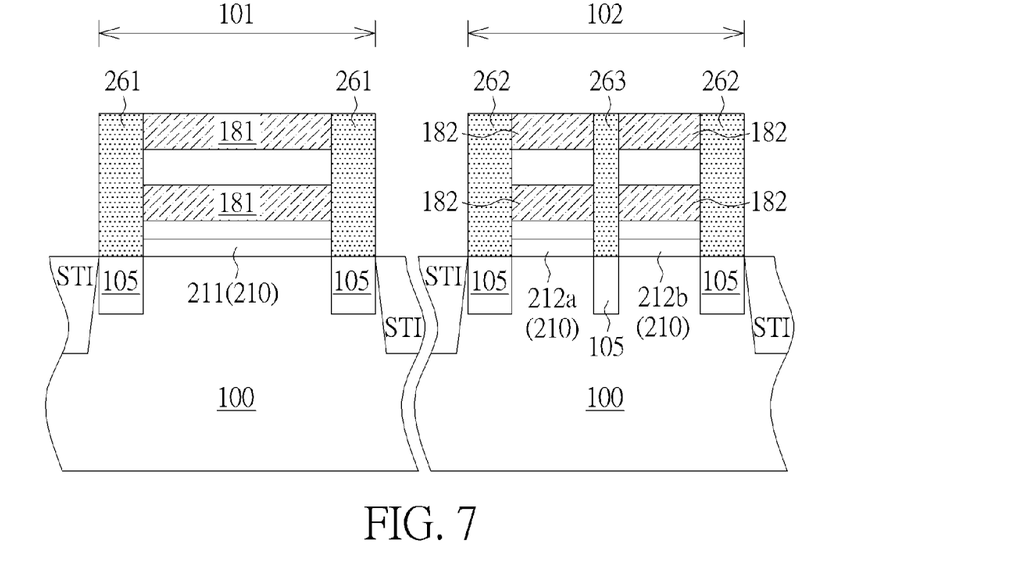

Following, as shown in FIG. 7, the dielectric layers 130, 110 stacked in the nanowire regions 171, 172 are removed through an etching process, to form nanowire structures 181, 182 mainly sustained by two ends thereof. It is noted that, in one embodiment, the supporting structure 263 formed additionally in the second active region 102 is formed between the source/drain structures 262 and divides the nanowire structure 182 into two parts, so as to obtain the function of further sustaining the nanowire structure 182, as shown in FIG. 7. It is also noted that, through the etching process, the dielectric layer 130 in the nanowire regions 171, 172 is completely removed, but the dielectric layer 110 in the nanowire regions 171, 172 is only partially removed. In other words, a certain thickness of the dielectric layer 110 remains on the substrate 100, within the nanowire regions 171, 172, and between the substrate 100 and the nanowire structures 181, 182, such that, dielectric layers 211, 212 are performed between the substrate 100 and the nanowire structures 181, 182, as shown in FIG. 7. In this way, except for the source/drain regions 151, 152 and the supporting region 153, there is a certain thickness of the dielectric layer 110, such as dielectric layers 211, 212, remaining on the substrate 100 to isolate the substrate 100 and the gate structure formed subsequently. Accordingly, the nanowire structures 181, 182 are suspended above the substrate 100, especially above the dielectric layers 211, 212 on the substrate 100, thereby being electrically isolated from the substrate 100. Also, in one embodiment, only the dielectric layer 130 and the second layer of the first dielectric layer 110 are removed in the etching process, so that, the first layer of the first dielectric layer 110 remains to function as the dielectric layers 211, 212.

Figure 8:
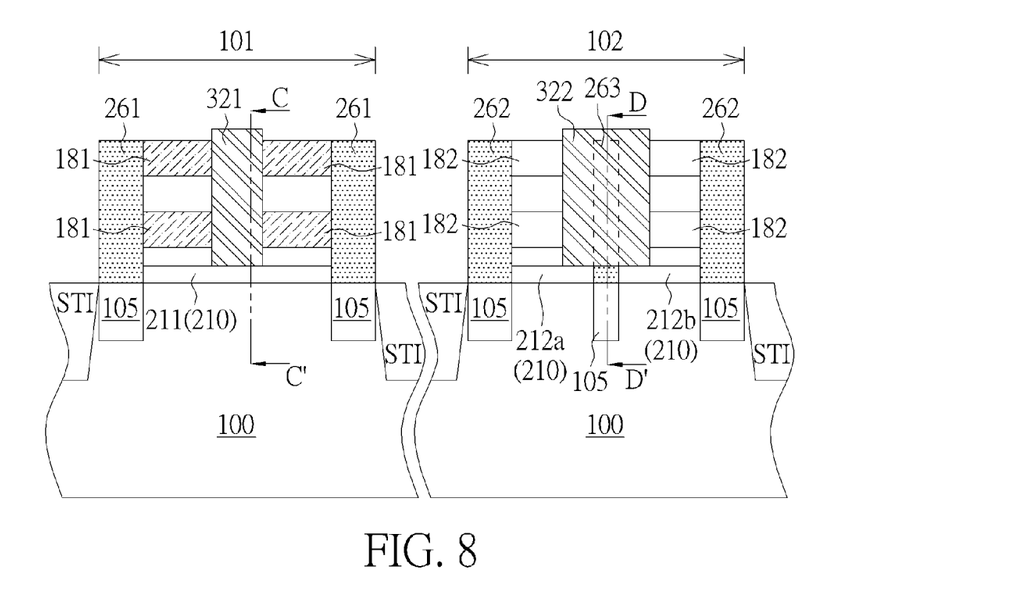
Figure 9:
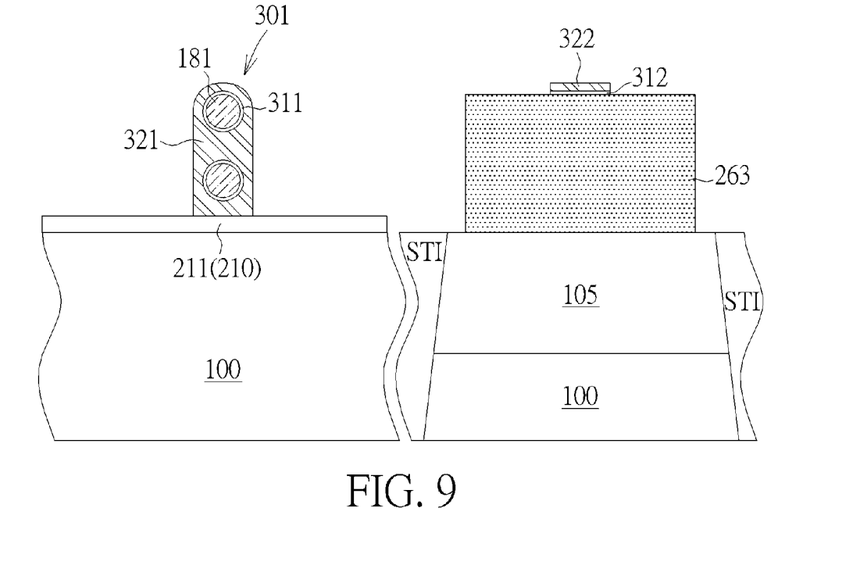

Finally, as shown in FIG. 8 and FIG. 9, FIG. 9 is a cross-sectional schematic view taken along the cross lines C-C' and D-D' in FIG. 8, which illustrates forming gate structures 301, 302 across the nanowire structures 181, 182 in the first active region 101 and the second active region 102 respectively. Precisely, the gate structures 301, 302 may be formed through entirely forming a gate dielectric layer (not shown in the drawings) on surfaces of the nanowire structures 181, 182 and the source/drain structures 261, 262, entirely forming a gate layer (not shown in the drawings) covering the nanowire structures 181, 182, and patterning the gate layer and the gate dielectric layer, to form gate electrodes 321, 322 which at least partially surround the nanowire structures 181, 182 respectively, for example to substantially surround ⅓ to ⅕ of a length of the nanowire structures 181, and to form gate dielectric layer 311, 312 between the gate electrodes 321, 322 and the nanowire structures 181, 182, as shown in FIG. 8. In one embodiment, a gate electrode (not shown in the drawings) surrounding a whole length of the nanowire structures 181 may be formed optionally through patterning the gate layer, such that, two ends of the gate electrodes may directly contact the gate dielectric layer formed on the source/drain structures 261.

On the other hand, the gate electrode 322 formed in the second active region 102 may also be formed to cover and to partially surround the supporting structure 263 and the nanowire structure 182 at two sides of the supporting structure 263, for example, to substantially surround ⅓ to ⅕ of a length of the nanowire structures 182, as shown in FIG. 8. Please note that, the gate electrode 322 formed in the second active region 102 only partially covers the supporting structure 263 in a direction parallel to the extending direction of the supporting structure 263, as shown in FIG. 9. Moreover, in another embodiment, a gate electrode (not shown in the drawings) surrounding a whole length of the nanowire structures 182 may also be formed, which means that the gate electrode completely covers the supporting structure 263 and the nanowire structure 182 at two sides of the supporting structure 263, thereby directly contacting the gate dielectric layer (not shown in the drawings) formed on the source/drain structures 262. Then, an implantation process may be further performed, to implant ion in the same conductive type to a portion of the gate structure 301, 302 uncovered by the gate electrodes 321, 322, to form a suitable source/drain doped regions (not shown in the drawings).

In another embodiment, the gate dielectric layer 311, 312 may include silicon oxide, silicon nitride, silicon oxynitride or other suitable high dielectric constant materials, and may be formed through a thermal oxidation process, so as to form the gate dielectric layer 311, 312 uniformly at external surfaces of the nanowire structures 181, 182 and the source/drain structures 261, 262, but not limited thereto. The gate electrodes 321, 322 may include polysilicon or a work function metal required by a metal gate. Furthermore, in another embodiment, an annealing process may be previously performed before the gate dielectric layers 311, 312 and the gate electrodes 321, 322 are formed, for example using a thermal process with hydrogen ($H_2$) or oxygen ($O_2$), to round the nanowire structures 181, 182. In other words, through the annealing process, corners of the nanowire structures 181, 182 are rounded, thereby performing a cylindrical cross-section as shown in FIG. 9. In another embodiment, according to the practical requirements, a trimming process may also be performed before the gate dielectric layers 311, 312 and the gate electrodes 321, 322 are formed, to further control the diameter of the nanowire structures 181, 182.

Through the aforementioned steps, the semiconductor device according to one preferred embodiment of the present invention is obtained, and which includes agate structure surrounding the nanowire structural channel, so as to perform like a gate-all-around transistor device. Also, through the forming method thereof in the present invention, the amorphous semiconductor material layers are directly formed previously, and then transformed into single crystal semiconductor material layers, so as to simplify the fabrication process of the nanowire structure, source/drain structure and the supporting structure, as well as to effectively control the critical dimension of the nanowire structure.

Figure 10:
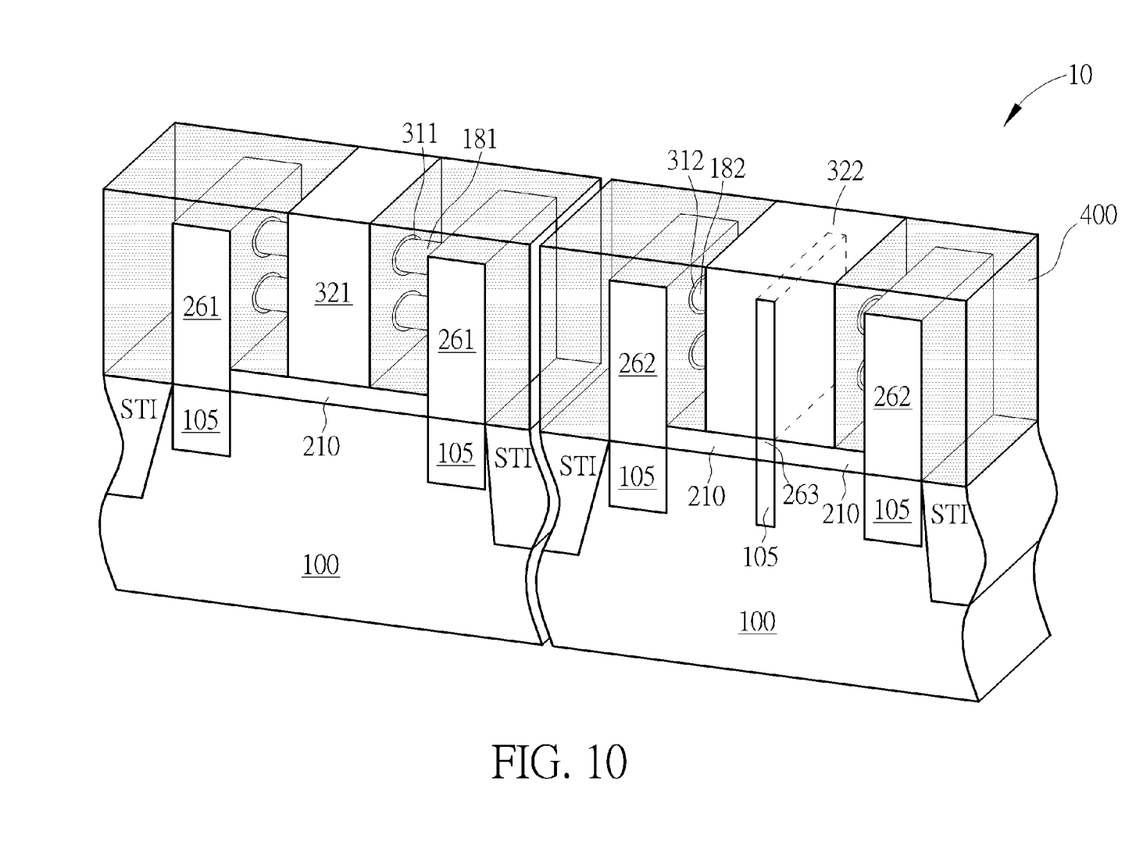
FIG. 10 is a schematic diagram illustrating a semiconductor device according to one preferred embodiment of the present invention.

Subsequently, an insulating material layer (not shown in the drawings) may be optionally formed entirely, to cover the substrate 100 and the nanowire structures 181, 182, and a planarization process is then performed to remove unnecessary portions of the insulating material layer, to form an insulating layer 400. The insulating layer 400 surrounds the whole nanowire structures 181, 182 and the source/drain structures 261, 262, to function as a second shallow trench isolation. In this way, the nanowire field effect transistor 10 is embedded in the first shallow trench isolation STI and the second shallow trench isolation (namely, insulating layer 400), as shown in FIG. 10. After that, a replacement metal gate (RMG) process may be performed then, wherein the aforementioned steps are similar to conventional forming process of a transistor and will not be further detailed herein.

Referring to FIG. 10, the nanowire filed effect transistor 10 according to one preferred embodiment of the present invention includes the single crystal substrate 100; the plurality of source/drain structures 261, 262 disposed on and directly contacted with the single crystal substrate 100; and the plurality of nanowire structures 181, 182 connected to those source/drain structures 261, 262 respectively. Furthermore, the nanowire filed effect transistor 10 also includes the gate electrodes 321, 322 which surround at least a portion of the nanowire structures 181, 182, and the gate dielectric layers 311, 312 being disposed between the gate electrodes 321, 322 and the nanowire structures 181, 182. It is noted that, the nanowire filed effect transistor 10 further includes the dielectric layer 210 (namely, the dielectric layers 211, 212), which is disposed on the single crystal substrate 100, between the nanowire structures 181, 182, and the single crystal substrate 100 to electrically isolate the single crystal substrate 100 and the gate electrodes formed on the nanowire structures 181, 182. Also, in another embodiment, the single crystal substrate 100 may also include the anti punch through implantation region 105, under the source/drain structures 261, 262.

Additionally, in one embodiment, the nanowire structures 181, 182, the single crystal substrate 100 and the source/drain structures 261, 262 may include different materials, preferably different single crystal semiconductor materials, such as single crystal silicon, single crystal germanium or single crystal silicon germanium. However, in other embodiments, the nanowire structures 181, 182, the single crystal substrate 100 and the source/drain structures 261, 262 may also include the same single crystal semiconductor material. Moreover, in another embodiment, the nanowire filed effect transistor 10 may also include the supporting structure 263, which is disposed on the single crystal substrate 100, between portions of the nanowire structure 182, to sustain the nanowire structure 182 in further. In another embodiment, the nanowire filed effect transistor 10 may also include plurality of shallow trench isolations STI disposed in the single crystal substrate 100 and surrounding the source/drain structures 261, 262.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   forming two dielectric layers and two first material layers stacked alternately on a substrate;
   etching the first material layers and the dielectric layers to expose a portion of the substrate;
   forming a second material layer on the portion of the substrate;
   transforming the first material layers into two single-crystal material layers; and
   completely removing the dielectric layer between the two single-crystal material layers and partially removing the dielectric layer between the single-crystal material layers and the substrate to leave a portion of the dielectric remained on the substrate and not in contact with the two single-crystal material layers, and to form a nanowire structure.

2. The method of forming a semiconductor device according to claim 1, further comprising:
   patterning the first material layers before the transforming of the first material layers.

3. The method of forming a semiconductor device according to claim 1, further comprising:
   patterning the first material layers after the transforming of the first material layers.

4. The method of forming a semiconductor device according to claim 1, wherein the transforming of the first material layers is performed through a thermal process or a laser irradiation process.

5. The method of forming a semiconductor device according to claim 1, wherein the second material layer directly contacts the portion of the substrate.

6. The method of forming a semiconductor device according to claim 1, wherein the portion of the substrate comprises a source/drain region or a supporting region.

7. The method of forming a semiconductor device according to claim 1, further comprising:
   performing an anti-punch through implantation process at the portion of the substrate.

8. The method of forming a semiconductor device according to claim 1, further comprising:
   forming a gate electrode at least partially surrounding the nanowire structure; and
   forming a gate dielectric layer between the gate electrode and the nanowire structure.

9. The method of forming a semiconductor device according to claim 8, wherein before the forming of the gate dielectric layer further comprises:
   performing an annealing process to round the nanowire structure.

10. The method of forming a semiconductor device according to claim 1, wherein the first material layers and the second material layer comprise different materials, or the first material layers and the substrate comprise different materials.

11. The method of forming a semiconductor device according to claim 1, wherein the second material layer is formed through a low temperature epitaxial process.

* * * * *